United States Patent
Ueda (10) Patent No.: US 6,387,735 B1
(45) Date of Patent: May 14, 2002

(54) METHOD FOR MANUFACTURING FIELD EFFECT TRANSISTOR CAPABLE OF SUCCESSFULLY CONTROLLING TRANSISTOR CHARACTERISTICS RELATING TO THE SHORT-CHANNEL EFFECT

(75) Inventor: Hirokazu Ueda, Hyogo (JP)

(73) Assignee: KMT Semiconductor, Ltd., Hyogo (JP)

(*) Notice: Subject to any disclaimer, the term of this patent is extended or adjusted under 35 U.S.C. 154(b) by 0 days.

(21) Appl. No.: 09/717,078

(22) Filed: Nov. 22, 2000

(30) Foreign Application Priority Data

Jan. 12, 2000 (JP) ............................. 2000-003512

(51) Int. Cl.[7] ............................................. H01L 21/339
(52) U.S. Cl. ............................................. 438/147; 438/207
(58) Field of Search ................... 438/231, 147, 438/286, 302, 307, 288, 217, 157, 291, 276, 128, 163

(56) References Cited

U.S. PATENT DOCUMENTS

| | | | | |
|---|---|---|---|---|
| B14,356,623 A | * | 7/1989 | Hunter | 437/44 |
| 5,756,381 A | * | 5/1998 | Buynoski | 438/199 |
| 6,084,269 A | * | 7/2000 | Davies et al. | 257/345 |
| 6,121,100 A | * | 9/2000 | Andideh et al. | 438/305 |
| 6,127,695 A | * | 10/2000 | Harris et al. | 257/77 |

* cited by examiner

*Primary Examiner*—David Nelms
*Assistant Examiner*—Thao P Le
(74) *Attorney, Agent, or Firm*—Troxell Law Office PLLC (57) ABSTRACT

A gate electrode having a gate length of 0.4 μm or less is formed on a semiconductor substrate. Gate length of this gate electrode is measured, and dose of ion implantation for forming the source region and the drain region is variably set according to the gate length measured value so that transistor characteristics relating to the short-channel effect comes to a specified level.

3 Claims, 5 Drawing Sheets

METHOD FOR MANUFACTURING FIELD EFFECT TRANSISTOR CAPABLE OF SUCCESSFULLY CONTROLLING TRANSISTOR CHARACTERISTICS RELATING TO THE SHORT-CHANNEL EFFECT

BACKGROUND OF THE INVENTION

The present invention relates to a method for manufacturing FET (Field Effect Transistor) and, more particularly, to a method for manufacturing FET having a fine gate on the order of submicrons. Such FET is used as a constituent element of semiconductor integrated circuit.

Figure 5:
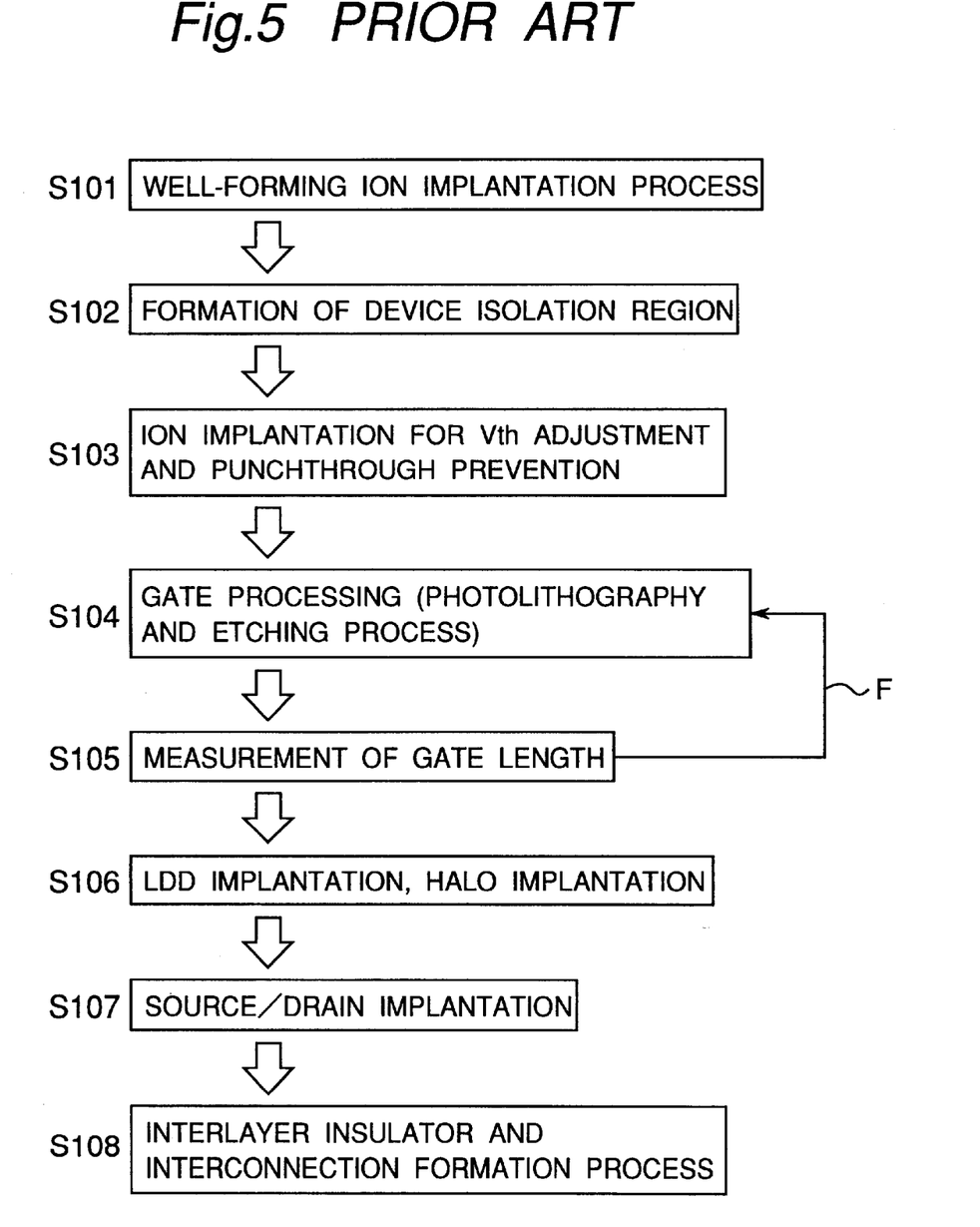
FIG. 5 is a chart showing the flow of the manufacturing process of CMOSLSI according to the prior art.

Conventionally, for example, CMOSLSI (Complementary Metal-Oxide Semiconductor Large-Scale Integrated circuit) having polycrystalline silicon gate is manufactured generally by a process flow as shown in FIG. 5. First, ion implantation is performed to form necessary wells on a semiconductor substrate (S101), and device isolation regions for isolating MOS transistors to be formed, from one another, is formed (S102). Next, ion implantation for adjusting the threshold value Vth of N-channel MOS transistor or P-channel MOS transistor and for preventing punchthrough is performed (S103). Next, after gate oxide is formed, polycrystalline silicon is deposited all over the substrate, and the polycrystalline silicon is processed by photolithography and etching, by which gate electrodes is formed (S104). Subsequently, measurement of gate length (line width measurement) is performed (S105). A result of this gate length measurement, i.e., a "shift" of gate length measured value of one lot from a target gate length is fed back to photolithography conditions and etching conditions for succeeding lots so that the gate length of succeeding lots becomes the target gate length (a control route therefor is shown by arrow F in FIG. 5). Next, with the gate electrode used as a mask, LDD (Lightly Doped Drain) implantation and halo-implantation are performed, by which LDD region and halo-implantation region are formed in both-side regions of the gate electrode (S106). Subsequently, side wall made of $SiO_2$ is formed on the side faces of the gate electrode, and source/drain implantation is performed with the gate electrode and the side walls used as a mask, by which source/drain region of high impurity concentration is formed at regions away from the gate electrode by a distance generally corresponding to the thickness of the side wall (S107). After this, an interlayer insulator is deposited all over the substrate, and heat treatment for activating the implanted impurities is performed. Then, contact windows are formed and wiring electrodes are formed (S108).

Figure 3:
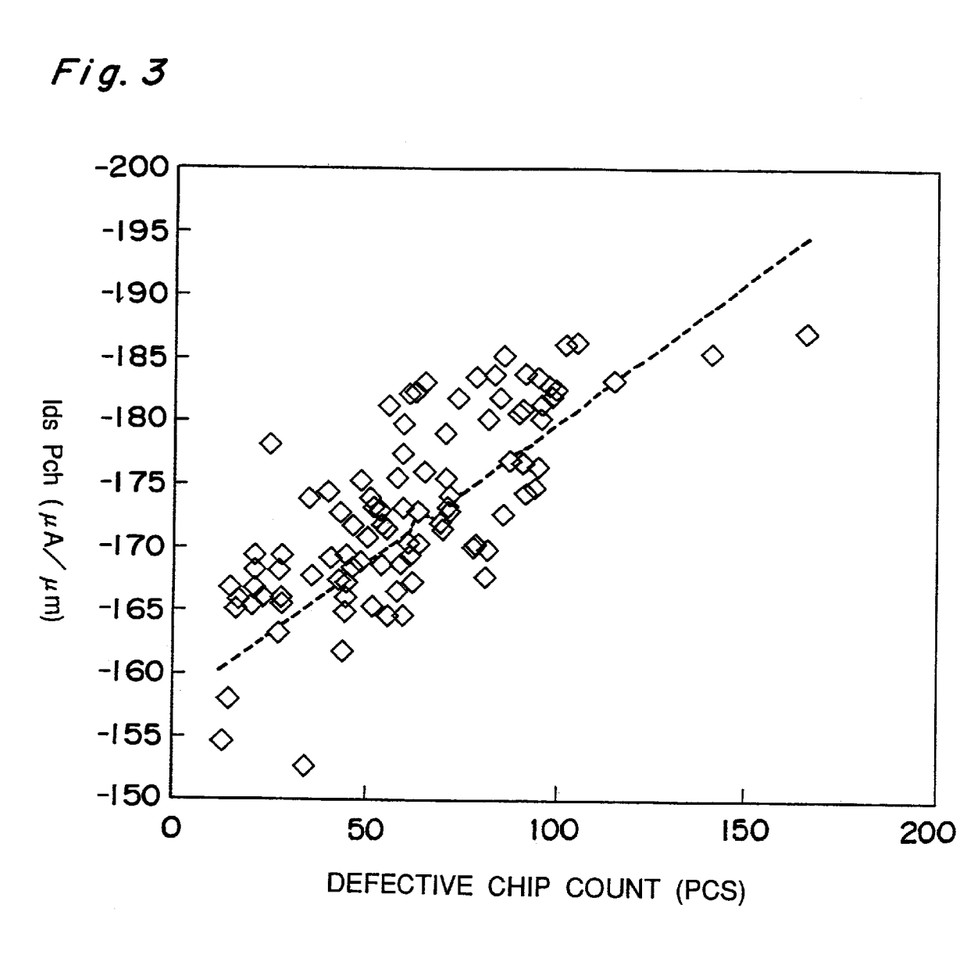
FIG. 3 is a chart showing correlation data between drain current IdsPch and the number of faulty chips in P-channel transistor.

As is well known, in MOS transistor having a gate length shorter than 1 $\mu$m, the channel effect becomes prominent so that variations in machining dimensions of the gate length largely affect the transistor characteristics (such as threshold voltage Vth, drain current Ids, drain withstand voltage BVds, etc.). For example, as shown in FIG. 3, as the drain current IdsPch of the P-channel transistor increases, the number of defective chips increases. Due to this, in the manufacturing process of MOS transistor having a gate length of the order of submicrons, it is of great importance to control the gate length. For this reason, as described above, a result of measuring the gate length of one lot is fed back to the photolithography conditions and etching conditions of succeeding lots.

Under the present circumstances, however, since the dimensional accuracy has reached to a limit even with the use of the state-of-the-art stepper, there is a possibility that the gate length of the lot may fall outside the permissible range (so-called specifications, which are previously set, for example, as +0.020 $\mu$m for a target gate length of 0.300 $\mu$m) due to weather conditions or the like. If the gate length of a lot falls outside the permissible range by the prior art manufacturing method, in which a step of determining or adjusting the transistor characteristics (Vth, Ids etc.) relating to the short-channel effect is involved before the step of gate electrode formation, there would inevitably occur lot rejection or yield lowering and, moreover, production efficiency (production output per unit time) lowering.

SUMMARY OF THE INVENTION

Therefore, an object of the present invention is to provide a method for manufacturing FET which is capable of successfully controlling transistor characteristics relating to the short-channel effect even if the gate length has varied to some extent in the step of gate electrode formation.

The present invention has been achieved based on a conception that for the process of manufacturing MOS transistor having a gate length of 0.40 $\mu$m or less, more prominently 0.35 $\mu$m or less, transistor characteristics relating to the short-channel effect can be controlled by changing the dose (implantation amount) for source and drain implantation.

That is, in the process of manufacturing MOS transistor having a gate length of about 0.4 $\mu$m to 0.5 $\mu$m or less, changing the gate length to such an extent as to cause changes in the transistor characteristics relating to the short-channel effect (changes of about 0.01 $\mu$m) would entail a need for changing the dose (implantation amount) for source and drain implantation about 0.5 to 3 folds. Such a large change in the dose for source and drain implantation would have a considerable influence on not only the transistor characteristics relating to the short-channel effect but also the contact resistance and the parasitic capacitance of the source/drain region. On this account, the idea that the transistor characteristics are controlled by changing the dose for source/drain implantation has never been provided so far.

However, the present inventor assumed that transistor characteristics relating to the short-channel effect could be controlled by changing the dose for source/drain implantation without adversely affecting the other transistor characteristics, and demonstrated the conception, when the target gate length becomes 0.40 $\mu$m or less, more prominently 0.35 $\mu$m or less.

Therefore, according to the present invention, there is provided a method for manufacturing a field effect transistor including the steps of forming a gate electrode having a gate length of 0.4 $\mu$m or less on a semiconductor substrate, and subsequently forming a source region and a drain region on a substrate surface on both sides of the gate electrode, respectively, the method further comprising the step of: with a gate length of the gate electrode measured, setting a dose of ion implantation for forming the source region and the drain region variably according to a measured value of the gate length so that transistor characteristics relating to short-channel effect of the field effect transistor to be formed are controlled to a specified level.

It is noted here that the terms, "characteristics relating to the short-channel effect," refer to characteristics that depend on the gate length such as threshold voltage Vth and drain current Ids.

In the method for manufacturing FET according to the present invention, a gate electrode having a gate length of 0.4 $\mu$m or less is formed on a semiconductor substrate. The gate length of this gate electrode is measured, and the dose of ion implantation for forming the source region and the drain region is set variably according to the gate length measured value. As a result of this, even if the gate length has varied to some extent in the step of gate electrode formation, the characteristics relating to the short-channel effect of FET to be formed can be controlled to a specified level. Accordingly, rejection of lots in the semiconductor manufacturing process can be avoided, so that yield and production efficiency can be enhanced.

More specifically, when the gate length measured value is larger than the target gate length, the dose of ion implantation for forming the source region and the drain region is set so as to be increased, and when the gate length measured value is smaller than the target gate length, the dose of ion implantation for forming the source region and the drain region is set so as to be decreased. When the dose of ion implantation for forming the source region and the drain region is increased, lateral diffusion of the source region and the drain region is increased and shifted in such a direction that the gate length is effectively decreased. On the other hand, when the dose of ion implantation for forming the source region and the drain region is decreased, the lateral diffusion of the source region and the drain region is decreased and shifted in such a direction that the gate length is effectively increased. As a result of this, variations of the gate length in the gate electrode formation step are substantially canceled, by which the characteristics relating to the short-channel effect of FET can be controlled to a specified level.

Further, a method of changing the dose of LDD (lightly doped drain) implantation and/or halo implantation (or pocket implantation) to be performed after the gate electrode formation step could also be conceived. However, in such cases, the transistor characteristics relating to the short-channel effect are so considerably changed as to be difficult to stably control. On the other hand, when the dose of ion implantation for forming the source/drain region of high impurity concentration, the transistor characteristics relating to the short-channel effect become so stable as to be gently changed.

Further, a method of changing the lateral diffusion amount of the source/drain region is changed by changing the annealing conditions after the source/drain implantation could also be conceived. However, for the setting of annealing conditions, it is practically difficult to finely control the lateral diffusion amount. On the other hand, the dose of ion implantation is set at high accuracy by normal functions of ion injectors (with Faraday cups or the like). It follows accordingly that a method of variably setting the dose of ion implantation for forming the source/drain region should be adopted as in this invention.

In an embodiment, the field effect transistor is a P-channel transistor; and the dose of ion implantation for forming the source region and the drain region is set to $2.5 \times 10^{15}$ atms/cm$^2$ when the gate length measured value is coincident with a target gate length, and changed within a range from $1.6 \times 10^{15}$ atms/cm$^2$ to $3.4 \times 10^{15}$ atms/cm$^2$ when the gate length measured value is not coincident with the target gate length.

With the method for manufacturing FET according to this one embodiment, even if the gate length has varied to some extent in the step of gate electrode formation, the characteristics relating to the short-channel effect of P-channel transistor is controlled to a specified level. Still, various transistor characteristics other than the characteristics relating to the short-channel effect are not adversely affected.

Also, in an embodiment, the field effect transistor is an N-channel transistor; and the dose of ion implantation for forming the source region and the drain region is set to $2.4 \times 10^{15}$ atms/cm$^2$ when the gate length measured value is coincident with a target gate length, and changed within a range from $1.5 \times 10^{15}$ atms/cm$^2$ to $4.0 \times 10^{15}$ atms/cm$^2$ when the gate length measured value is not coincident with the target gate length.

With the method for manufacturing FET according to this one embodiment, even if the gate length has varied to some extent in the step of gate electrode formation, the characteristics relating to the short-channel effect of N-channel transistor is controlled to a specified level. Still, various transistor characteristics other than the characteristics relating to the short-channel effect are not adversely affected.

More specifically, first, Table 1 given below shows ranges of drain current IdsPch (unit: $\mu A/\mu m$) of P-channel MOS transistor (hereinafter, referred to as "P-channel transistor"), ranges of drain current IdsNch (unit: $82A/\mu m$) of N-channel MOS transistor (hereinafter, referred to as "N-channel transistor"), and tolerances of gate length (unit: $\mu m$), when the target gate length is 1.00 $\mu m$, 0.50 $\mu m$, 0.40 $\mu m$, 0.35 $\mu m$, 0.30 $\mu m$, 0.25 $\mu m$ and 0.20 $\mu m$, respectively. As to the target threshold voltages, VthNch=0.5 to 0.6 (V), VthPch=−0.5 to −0.6 (V). In addition, the drain currents IdsPch and IdsNch are specified in volume for a channel width of 1 $\mu m$.

TABLE 1

| Target gate length ($\mu m$) | IdsPch ($\mu A/\mu m$) | IdsNch ($\mu A/\mu m$) | Gate length tolerance ($\mu m$) |
|---|---|---|---|
| 1.00 | −100 ± 50 | 180 ± 60 | 1.00 ± 0.1 |
| 0.50 | −120 ± 40 | 240 ± 50 | 0.50 ± 0.05 |
| 0.40 | −125 ± 15 | 240 ± 30 | 0.40 ± 0.05 |
| 0.35 | −140 ± 15 | 270 ± 30 | 0.35 ± 0.04 |
| 0.30 | −165 ± 15 | 320 ± 30 | 0.30 ± 0.03 |
| 0.25 | −190 ± 15 | 390 ± 30 | 0.25 ± 0.02 |
| 0.20 | −220 ± 15 | 480 ± 30 | 0.20 ± 0.015 |

Target threshold voltage:

VthNch=0.5 to 0.6 (V), VthPch=−0.5 to −0.6 (V)

Next, Table 2 shows data of dose changes (unit: atms/cm$^2$) required to change the drain current IdsPch of P-channel transistor by 10 $\mu A/\mu m$, and data of gate length shift amounts (unit: $\mu m$) that cause IdsPch to change by 10 $\mu A/\mu m$, when the target gate length is 1.00 $\mu m$, 0.50 $\mu m$, 0.40 $\mu m$, 0.35 $\mu m$, 0.30 $\mu m$, 0.25 $\mu m$ and 0.20 $\mu m$, respectively. In this case, the conditions for ion implantation of the source/drain region of P-channel transistor is an ion species of BF$_2^+$, an accelerating energy of 25 keV and a dose median of $2.5 \times 10^{15}$ atms/cm$^2$.

Figure 4:
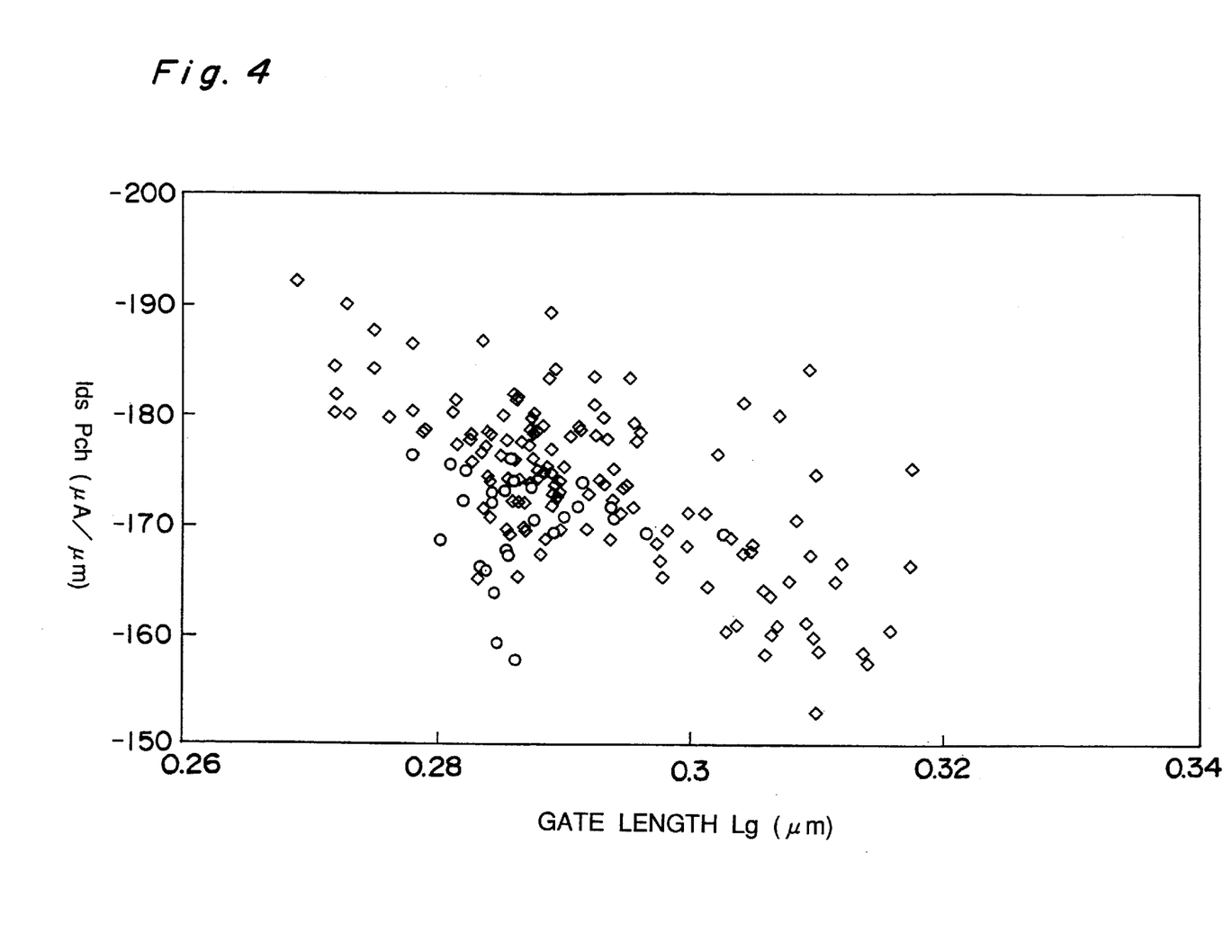
FIG. 4 is a chart showing correlation data between drain current IdsPch and gate lengths (measured values) in P-channel transistor.

For instance, with respect to P-channel transistor having a gate length of 0.30 $\mu m$, which is today's mainstream, it can be seen from correlation data between IdsPch and gate length (measured values) shown in FIG. 4 that when the gate length has changed by 0.01 $\mu m$, the drain current IdsPch changes by 12 $\mu A/\mu m$. Like this, the values in Table 2 were determined based on actually measured correlation data (however, data on the target gate lengths of 1.00 $\mu m$ and 0.50 $\mu m$ are ones estimated by extrapolation, which is also applicable to Table 3).

Similarly, Table 3 shows data of dose changes (unit: atms/cm$^2$) required to change the drain current IdsNch of N-channel transistor by 10 $\mu A/\mu m$, and data of gate length shift amounts (unit: $\mu m$) that cause IdsNch to change by 20 $\mu A/\mu m$, when the target gate length is 1.00 $\mu m$, 0.50 $\mu m$, 0.40 $\mu m$, 0.35 $\mu m$, 0.30 $\mu m$, 0.25 $\mu m$ and 0.20 $\mu m$, respectively. In this case, the conditions for ion implantation of the source/drain region of N-channel transistor is an ion species of $As^+$, an accelerating energy of 20 keV and a dose median of $2.4 \times 10^{15}$ atms/cm$^2$.

TABLE 2

| Target gate length ($\mu$m) | Dose change required to change IdsPch by 10 $\mu$A/$\mu$m (atms/cm$^2$) | Gate length shift amount that causes IdsPch to change by 10 $\mu$A/$\mu$m ($\mu$m) |
|---|---|---|
| 1.00 | $1 \times 10^{15}$ over | 0.08 |
| 0.50 | $1 \times 10^{15}$ over | 0.025 |
| 0.40 | $0.6 \times 10^{15}$ | 0.021 |
| 0.35 | $0.5 \times 10^{15}$ | 0.017 |
| 0.30 | $0.35 \times 10^{15}$ | 0.012 |
| 0.25 | $0.26 \times 10^{15}$ | 0.009 |
| 0.20 | $0.18 \times 10^{15}$ | 0.006 |

Conditions for ion implantation of P-channel source/drain region: ion species of $BF_2^+$; accelerating energy of 25 keV; and dose median of $2.5 \times 10^{15}$ atms/cm$^2$.

TABLE 3

| Target gate length ($\mu$m) | Dose change required to change IdsNch by 10 $\mu$A/$\mu$m (atms/cm$^2$) | Gate length shift amount that causes IdsNch to change by 20 $\mu$A/$\mu$m ($\mu$m) |
|---|---|---|
| 1.00 | $2.0 \times 10^{15}$ over | 0.08 |
| 0.50 | $1.5 \times 10^{15}$ over | 0.025 |
| 0.40 | $0.86 \times 10^{15}$ | 0.021 |
| 0.35 | $0.70 \times 10^{15}$ | 0.017 |
| 0.30 | $0.50 \times 10^{15}$ | 0.012 |
| 0.25 | $0.37 \times 10^{15}$ | 0.009 |
| 0.20 | $0.25 \times 10^{15}$ | 0.006 |

Conditions for ion implantation of N-channel source/drain region: ion species of $As^+$; accelerating energy of 20 keV; and dose median of $2.4 \times 10^{15}$ atms/cm$^2$.

Table 4 shows dose ranges (unit: atms/cm$^2$) that cover the ranges of the drain currents IdsPch and IdsNch shown in Table 1 in correspondence to the correspondence between the changes in IdsPch, IdsNch and dose changes shown in Tables 2 and 3, when the target gate length is 1.00 $\mu$m, 0.50 $\mu$m, 0.40 $\mu$m, 0.35 $\mu$m, 0.30 $\mu$m, 0.25 $\mu$m and 0.20 $\mu$m, respectively. In this case, the conditions for ion implantation of the source/drain region of P-channel transistor and N-channel transistor are the same as in Tables 2 and 3, respectively.

TABLE 4

| Target gate length ($\mu$m) | Dose to be set for ion implantation of P-channel source/drain region (atms/cm$^2$) | Dose to be set for ion implantation of channel source/drain region (atms/cm$^2$) |
|---|---|---|
| 1.00 | $1.5 \times 10^{15}$–$5.0 \times 10^{15}$ | $1.5 \times 10^{15}$–$5.0 \times 10^{15}$ |
| 0.50 | $1.5 \times 10^{15}$–$3.5 \times 10^{15}$ | $1.5 \times 10^{15}$–$4.0 \times 10^{15}$ |
| 0.40 | $1.6 \times 10^{15}$–$3.4 \times 10^{15}$ | $1.5 \times 10^{15}$–$4.0 \times 10^{15}$ |
| 0.35 | $1.8 \times 10^{15}$–$3.2 \times 10^{15}$ | $1.6 \times 10^{15}$–$4.0 \times 10^{15}$ |
| 0.30 | $2.0 \times 10^{15}$–$3.0 \times 10^{15}$ | $1.8 \times 10^{15}$–$3.7 \times 10^{15}$ |
| 0.25 | $2.1 \times 10^{15}$–$2.9 \times 10^{15}$ | $1.9 \times 10^{15}$–$3.5 \times 10^{15}$ |
| 0.20 | $2.2 \times 10^{15}$–$2.8 \times 10^{15}$ | $2.0 \times 10^{15}$–$3.3 \times 10^{15}$ |

As can be understood from this Table 4, when the target gate length is 0.40 $\mu$m or less, the dose setting range for source/drain implantation becomes a practical level.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the method for manufacturing FET according to the present invention is described in detail by way of embodiments thereof illustrated in the accompanying drawings.

Figure 1:
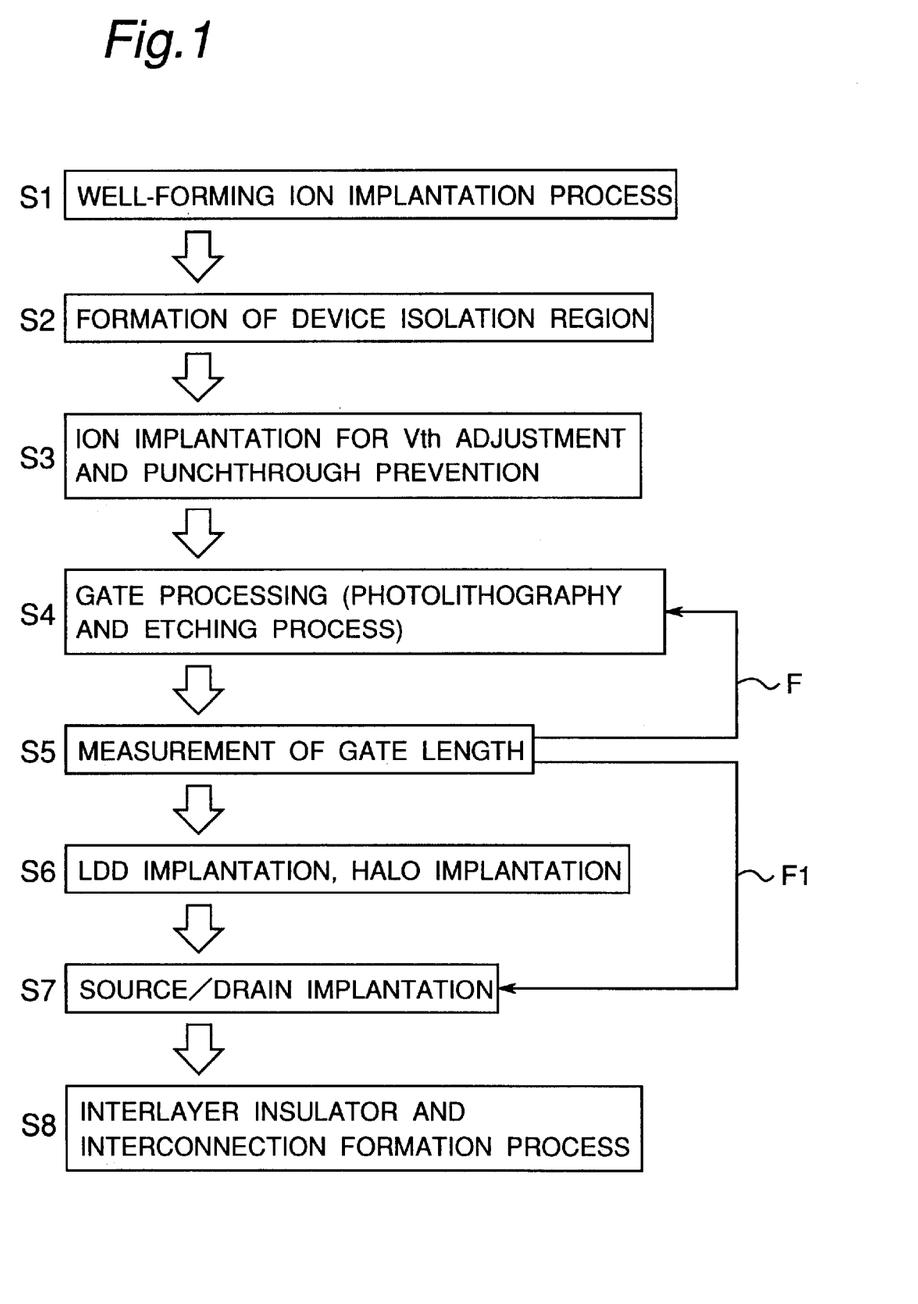
FIG. 1 is a chart showing the flow of the manufacturing process of CMOSLSI to which the present invention is applied.

FIG. 1 shows the process flow in manufacturing CMOSLSI having a polycrystalline silicon gate according to the present invention. FIGS. 2A–2D are process charts in cross section thereof.

Figure 2A:
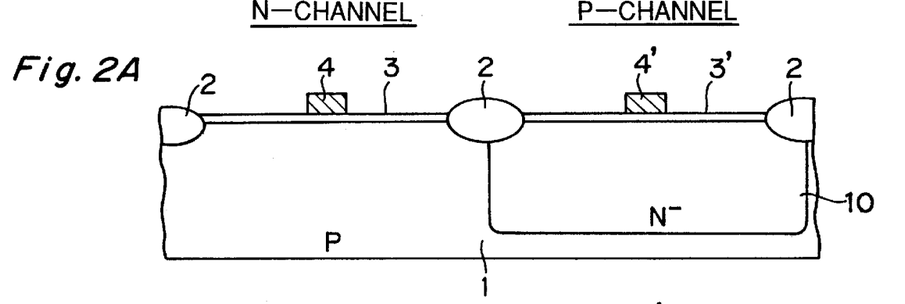
FIGS. 2A, 2B, 2C and 2D are process charts in cross section corresponding to the flow of FIG. 1.

(1) First, as shown in FIG. 2A, ion implantation is performed over regions within a P-type silicon substrate 1 where the P-channel transistor is to be formed, by which N⁻well is formed (S1). Subsequently, device isolation regions for isolating MOS transistors to be formed, from one another, are formed (S2).

(2) Next, ion implantation ($B^+$ ions) is performed for adjusting the threshold voltage Vth of N-channel transistor and P-channel transistor and preventing punchthrough (S3). In this case, for example, the impurity concentration for the N-channel region is set to within a range of $1.0 \times 10^{17}$ atms/cm$^3$ to $1.0 \times 10^{18}$ atms/cm$^3$, and the impurity concentration for the P-channel region is set to within a range of $1.0 \times 10^{16}$ atms/cm$^3$ to $1.0 \times 10^{17}$ atms/cm$^3$.

(3) Next, after gate oxides 3, 3' are formed, polycrystalline silicon is deposited all over the substrate 1, and photolithography and etching are performed to process the polycrystalline silicon, by which gate electrodes 4, 4' are formed (S4). Subsequently, gate length is measured (line width measurement) (S5). A result of this gate length measurement, i.e., a "shift" of a gate length measured value of one lot from a target gate length is fed back to photolithography conditions and etching conditions for succeeding lots so that the gate length of succeeding lots becomes the target gate length (a control route therefor is shown by arrow F in FIG. 1).

Figure 2B:
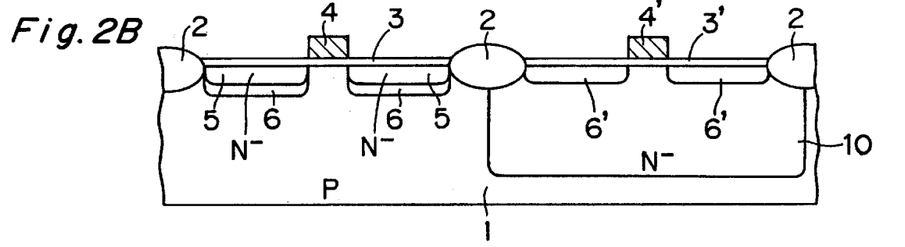

(4) Next, as shown in FIG. 2B, with the gate electrode 4 used as a mask, LDD (lightly doped drain) implantation is performed, by which LDD region 5 of low impurity concentration is formed on both sides of the gate electrode 4 on the N-channel side (S6). Concurrently with this, on the P-channel side, with the gate electrode 4' used as a mask, halo implantation region 6' of low impurity concentration is formed on both sides of the gate electrode 4' (S6). Conditions for this ion implantation for forming the LDD region 5 on the N-channel side and the halo implantation region 6' on the P-channel side are an ion species of $P^+$, an accelerating energy within a range of 15 keV–25 keV, and a dose within a range of $1.0 \times 10^{12}$ atms/cm$^2$–$5.0 \times 10^{12}$ atms/cm$^2$. In addition, in this embodiment, the LDD region is not formed on the P-channel side.

(5) Subsequently, a photolithography process is performed, by which the P-channel side region is covered with an unshown resist mask. In this state, halo implantation is performed with the gate electrode 4 used as a mask, by which halo implantation region 6 is formed on both sides of the gate electrode 4 on the N-channel side. Conditions for this ion implantation for forming the halo implantation region 6 on the N-channel side are an ion species of B$^+$, an accelerating energy within a range of 40 keV–60 keV, a dose within a range of $1.0 \times 10^{12}$ atms/cm$^2$–$10 \times 10^{12}$ atms/cm$^2$, and an oblique ion implantation inclined 15 degrees to 30 degrees with respect to the substrate. It is assumed that the ion implantation is performed generally vertically to the substrate, unless otherwise specified.

Figure 2C:
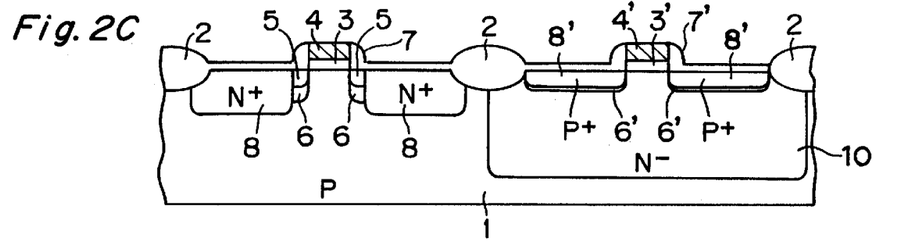

(6) Next, as shown in FIG. 2C, side wall 7 made of SiO$_2$ is formed on the side faces of the gate electrode 4 on the N-channel side. Concurrently with this, although not particularly required, side wall 7' made of SiO$_2$ is formed on the side faces of the gate electrode 4' also on the P-channel side. Subsequently, the P-channel region is covered with an unshown resist mask by performing photolithography. Then, source/drain implantation is performed with the gate electrode 4 and the side walls 7 used as a mask, by which source/drain region 8 of high impurity concentration is formed on both sides of the gate electrode 4 (S7). In this case, conditions for the ion implantation for forming the source/drain region 8 on the N-channel side are an ion species of As$^+$, an accelerating energy within a range of 15 keV–25 keV, and a dose set according to results of gate length measurement (a control route therefor is shown by arrow F1 in FIG. 1).

Also, the N-channel side region is covered with an unshown resist mask by performing photolithography. Then, source/drain implantation is performed on the P-channel side with the gate electrode 4' and the side walls 7' used as a mask, by which source/drain region 8' of high impurity concentration is formed on both sides of the gate electrode 4' (S7). In this case, conditions for the ion implantation for forming the source/drain region 8' on the P-channel side are an ion species of BF$_2^+$, an accelerating energy within a range of 15 keV–25 keV, and a dose set according to results of gate length measurement (a control route therefor is shown by arrow F1 in FIG. 1).

After this, as a heat treatment for activating the implanted impurities, a lamp annealing process is performed at a temperature of 1000° C. for a period within a range of 20–60 seconds.

Further, as those skilled in the art could understood, the step of forming the source/drain region 8 on the N-channel side and the step of forming the source/drain region 8' on the P-channel side may be replaced with each other.

Figure 2D:
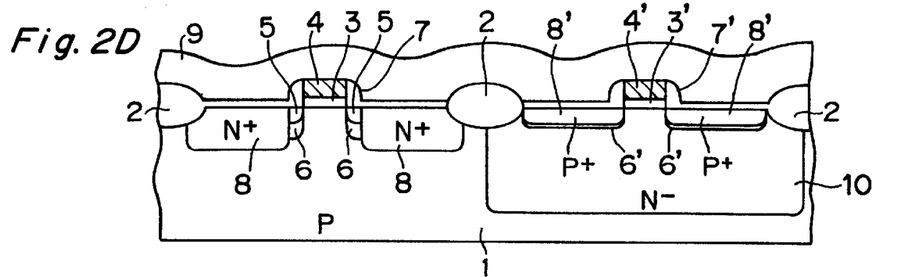

(7) After this, as shown in FIG. 2D, an interlayer insulator 9 is deposited all over the substrate 1, and heat treatment for making reflow of this interlayer insulator 9 is performed at a temperature of 700° C.–800° C. and for a period within a range of 20 to 30 min. with an electric furnace. Then, contact windows are formed and wiring electrodes are formed by a known method (S8).

Next, with respect to the ion implantation for forming the source/drain region 8' on the P-channel side, the way for setting the dose is explained by concrete examples.

In this example, it is assumed that the target gate length is 0.30 μm for the manufacture of 64 megabit DRAM (Dynamic Random Access Memory). By the existing photolithography and etching machining accuracy, there is a possibility that the actual gate length could fall outside the tolerance of 0.30 μm±0.02 μm, which is a common setting.

However, it has been found from the foregoing Table 2 that for transistors having a gate length of about 0.30 μm, changing the dose of source/drain implantation in P-channel transistor by $3.5 \times 10^{14}$ (atms/cm$^2$) is equivalent to changing the gate length by about 0.01 μm.

Therefore, as shown below, the dose of source/drain implantation (with an ion species of BF$_2^+$) is variably set according to the gate length measured value. Given a gate length measured value Lg (unit: μm) for one lot, i) if Lg>0.34 μm, then the lot is regarded as a rejected article and is discarded;

ii) if 0.34 μm>Lg>0.30 μm, then the dose of source/drain implantation (with an ion species of BF$_2^+$) for the P-channel transistor is set to $2.5 \times 10^{15}$ (atms/cm$^2$);

iii) if 0.30 μm>Lg>0.26 μm, then the dose of source/drain implantation (with an ion species of BF$_2^+$) for the P-channel transistor is set to $2.15 \times 10^{15}$ (atms/cm$^2$); and iv) if Lg<0.26 μm, then the lot is regarded as a rejected article and is discarded.

Like this, if the gate length measured value Lg is larger than the target gate length of 0.30 μm, the dose of source/drain implantation is set so as to be increased, and if the gate length measured value Lg is smaller than the target gate length of 0.30 μm, the dose of source/drain implantation is set so as to be decreased. When the dose of source/drain implantation is increased, lateral diffusion of the source/drain region 8' is increased and shifted in such a direction that the gate length is effectively decreased. On the other hand, when the dose of source/drain implantation is decreased, lateral diffusion of the source/drain region 8' is decreased and shifted in such a direction that the gate length is effectively increased. As a result of this, variations in the gate length in the gate electrode formation step can substantially be canceled out, so that the transistor characteristics relating to the short-channel effect can be controlled to a specified level. This means, conversely, that the tolerance of gate length can be broadened to an extent corresponding to the controllable extent of lateral diffusion of source/drain implantation by the dose.

Although this embodiment has been described with respect to the manufacturing method for CMOSLSI, the present invention is not limited to this, needless to say. The present invention is widely applicable to manufacture of various kinds of FETs.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a field effect transistor including the steps of forming a gate electrode having a gate length of 0.4 μm or less on a semiconductor substrate, and subsequently forming a source region and a drain region on a substrate surface on both sides of the gate electrode, respectively, the method further comprising the steps of:

a) establishing a target gate length;

b) measuring a gate length of the gate electrode to determine a measured value; and, c) applying a dose of ion implantation for forming the source region and the drain region based on the measured value of the gate length such that the dose is increased above an initial value if the measured gate length is larger than the target gate length, and such that the dose is decreased below the initial value if the measured gate length is less than the target gate length.

2. The method for manufacturing a field effect transistor according to claim 1, wherein the field effect transistor is a P-channel transistor; and the dose of ion implantation for forming the source region and the drain region is set to $2.5 \times 10^{15}$ atms/cm$^2$ when the gate length measured value is coincident with a target gate length, and changed within a range from $1.6 \times 10^{15}$ atms/cm$^2$ to $3.4 \times 10^{15}$ atms/cm$^2$ when the gate length measured value is not coincident with the target gate length.

3. The method for manufacturing a field effect transistor according to claim 1, wherein the field effect transistor is an N-channel transistor; and the dose of ion implantation for forming the source region and the drain region is set to $2.4 \times 10^{15}$ atms/cm$^2$ when the gate length measured value is coincident with a target gate length, and changed within a range from $1.5 \times 10^{15}$ atms/cm$^2$ to $4.0 \times 10^{15}$ atms/cm$^2$ when the gate length measured value is not coincident with the target gate length.

* * * * *